(12) United States Patent
Turcotte

(10) Patent No.: US 6,960,931 B2
(45) Date of Patent: Nov. 1, 2005

(54) LOW VOLTAGE DIFFERENTIAL SIGNAL DRIVER CIRCUIT AND METHOD

(75) Inventor: Marc Turcotte, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/283,721

(22) Filed: Oct. 30, 2002

(65) Prior Publication Data

US 2005/0073338 A1 Apr. 7, 2005

(51) Int. Cl.[7] ............................................ H03K 19/003
(52) U.S. Cl. ............................ 326/30; 326/32; 326/34
(58) Field of Search ............................... 326/30–34, 87

(56) References Cited

U.S. PATENT DOCUMENTS

| | | | |
|---|---|---|---|
| 5,739,707 A | * | 4/1998 | Barraclough ................ 327/112 |
| 5,767,698 A | | 6/1998 | Emeigh et al. |
| 5,977,796 A | | 11/1999 | Gabara |
| 6,111,433 A | * | 8/2000 | Fotouhi et al. ................ 326/87 |
| 6,222,388 B1 | | 4/2001 | Bridgewater, Jr. |

OTHER PUBLICATIONS

Draft 1.3 IEEE P1596.3–1995, "Draft Standard for Low–Voltage Differential Signals (LVDS) for Scalable Coherent Interface (SCI)," Draft 1.3, Dated: Nov. 27, 1995, by the Institute of Electrical and Electronics Engineers, Inc.

* cited by examiner

Primary Examiner—Anh Q. Tran
(74) Attorney, Agent, or Firm—Richard A. Henkler; Hoffman, Warnick & D'Alessandro LLC

(57) ABSTRACT

A low voltage differential signal driver that generates a differential signal using a switching sequencer for ensuring uniform transitions of the output signals, and a driver that includes a network of matched resistors for generating the output signals. The network of matched resistors can be configured based on one or more sequencing signals generated by the switching sequencer.

15 Claims, 5 Drawing Sheets

LOW VOLTAGE DIFFERENTIAL SIGNAL DRIVER CIRCUIT AND METHOD

BACKGROUND OF THE INVENTION

1. Technical Field

The current invention relates to low voltage differential signal (LVDS) drivers. In particular, this invention relates to a LVDS circuit and method that generate the output signals using a network of matched resistors that are configured based on a switching sequencer.

2. Background Art

Current trends in computer hardware are toward higher frequency applications. As a result, bandwidth interfaces in excess of one gigabit per second are now becoming more common. However, the speed in which board components in hardware such as routers, ethernet communications, and cellular telephone base stations interface is limited by physical constraints including board space, chip pin quantities, etc. As a result, currently available bandwidth capabilities exceed the limitations of current printed circuit board and chip packaging technologies.

LVDS drivers provide one solution to this problem. An LVDS driver represents a digital value as a differential voltage signal. The differential voltage signal is represented by the voltage difference between two output lines. The signals on the two output lines always complement each other with a higher voltage on a first line representing a digital value of one, and a higher voltage on the second line representing a digital value of zero.

The Institute for Electrical and Electronic Engineers, Inc. (IEEE) Standard 1596 addresses LVDS performance requirements. Under the standard, an LVDS driver transmits a low voltage differential signal to a resistively terminated differential receiver. The differential receiver resolves the true signal by amplifying the voltage difference across the termination resistor. The amplified signal is clamped to ground or to the power supply voltage ($V_{dd}$), and is available for use by the internal logic elements on the receiver.

Current implementations of the LVDS circuit typically include one or more current sources and sinks. The current source is used to provide the 'Hi' signal, and the current sink provides the 'Lo' signal. The 'Hi' and 'Lo' signals are matched using a current mirror. However, implementation of the current mirror includes several limitations that make compliance with IEEE Std 1596 difficult. For example, the standard specifies that an impedance at each output be between 40 Ohms and 140 Ohms. Because an ideal current source represents infinite impedance, it is difficult to construct current source and sink elements that meet this standard. Similarly, it is difficult to construct a circuit having an impedance difference between both output signals within the ten percent error specified by IEEE.

Additionally, IEEE Std 1596 specifies that the output offset voltage ($V_{os}$) must be regulated between 1.125 V and 1.275 V. Current LVDS circuit implementations frequently use a feedback circuit in conjunction with a voltage reference to satisfy this IEEE specification. In this case, a driver's output voltages are sensed and compared with a reference voltage. The output voltages are then modified as required to match the reference value. However, the addition of a feedback stage requires considerable analysis in order to insure stability and to minimize drift in the output voltages. Further, the use of a feedback amplifier also requires considerable time (i.e., more than 10 nanoseconds) for the circuit to recover from being tristated (disabled).

As a result, there exists a need for a LVDS circuit and method that eliminate the complexities and deficiencies of the current techniques. In particular, there exists a need for an LVDS circuit in which a desired impedance value and balance can be easily obtained. Further, there exists a need for a LVDS circuit and method that allow for quicker recovery from tristate. Still further, there exists a need for a LVDS circuit and method that solve the above needs while being compatible with the relevant specifications of IEEE Std 1596.

SUMMARY OF THE INVENTION

The current invention provides a method and circuit for generating a differential voltage signal. A digital input is provided to a switching sequencer that provides for uniform transitions between voltage signals at the output pads. A driver generates each voltage signal using a network of matched resistors.

A first aspect of the invention provides a differential signal driver, comprising: a driver for generating a first output signal and a second output signal, the driver including an output stage comprising a network of matched resistors; and a switching sequencer for ensuring uniform transitions of the first output signal and the second output signal.

A second aspect of the invention provides a circuit for generating a differential voltage signal, comprising: a first resistor network for generating a first voltage level at a first output; and a second resistor network for generating a second voltage level at a second output; wherein the first resistor network and the second resistor network are substantially identical, and wherein the first voltage level and the second voltage level transitions are based on a plurality of sequencing signals.

A third aspect of the invention provides a method of generating a differential voltage signal, comprising: receiving a digital input; providing a plurality of sequencing signals based on the digital input; configuring a first resistor network and a second resistor network based on the plurality of sequencing signals; generating a first voltage at a first output based on the first resistor network; and generating a second voltage at a second output based on the second resistor network, wherein a difference of the first voltage and the second voltage comprises the differential voltage signal.

The illustrative aspects of the present invention are designed to solve the problems herein described and other problems not discussed, which are discoverable by a skilled artisan.

BRIEF DESCRIPTION OF THE DRAWINGS

These and other features of this invention will be more readily understood from the following detailed description of the various aspects of the invention taken in conjunction with the accompanying drawings in which.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

The current invention provides a LVDS circuit and method that generate the output signals using a network of matched resistors for generating the output signals, and a switching sequencer for ensuring uniform transitions of the output signals.

Figure 1:
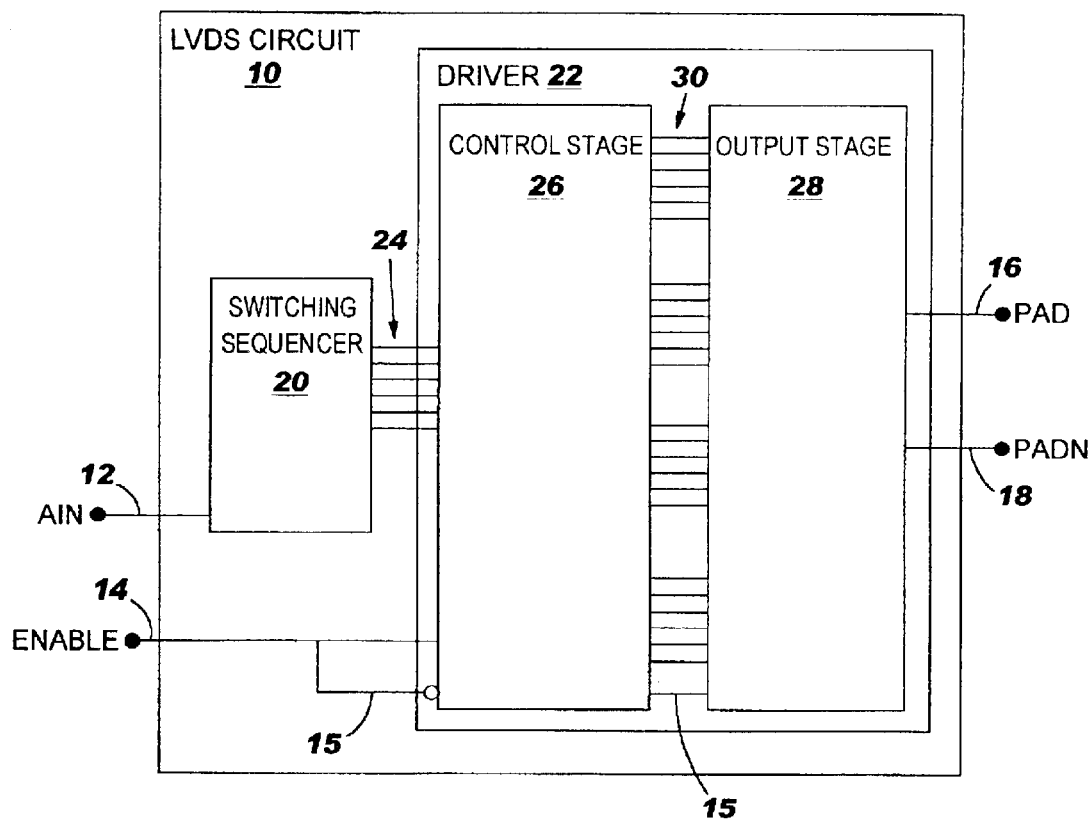
FIG. 1 depicts a functional block diagram of an LVDS circuit according to one aspect of the invention.

Turning to the figures, FIG. 1 depicts a functional block diagram of an LVDS circuit 10 according to one aspect of the invention. Circuit 10 accepts a digital input 12 and an enable 14 and produces voltage output signals at outputs 16, 18. The output signals represent the value of input 12 as a voltage differential. For example, when input 12 has a value of a digital one, circuit 10 generates an output signal at output 16 that is higher than an output signal at output 18. Conversely, when input 12 is a digital zero, circuit 10 generates an output signal at output 18 that is higher than an output signal at output 16.

Figure 2:
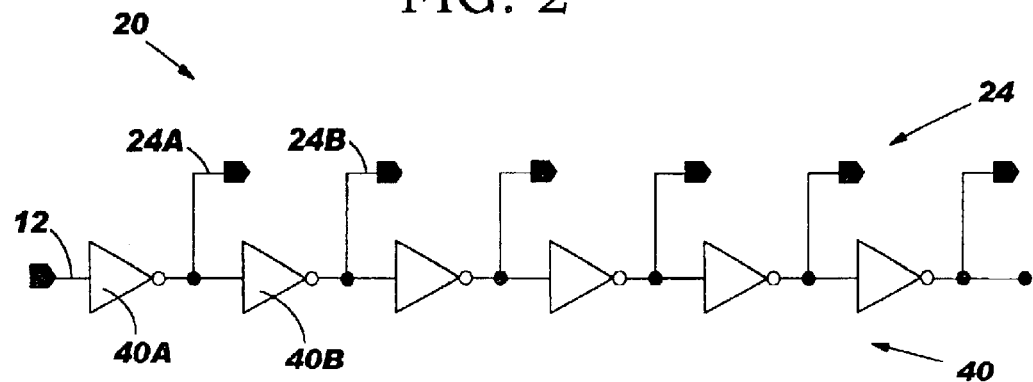
FIG. 2 depicts a schematic diagram of one implementation of the switching sequencer shown in FIG. 1.

Circuit 10 includes a switching sequencer 20 and a driver 22. Switching sequencer 20 accepts input 12 and produces a plurality of sequencing signals 24. Sequencing signals 24 are provided to driver 22 for generating uniform transitions of the output signals between high and low voltages at outputs 16, 18. FIG. 2 depicts a schematic diagram of an illustrative implementation of switching sequencer 20. In this case, switching sequencer 20 includes a plurality of inverters 40 placed in series to yield the plurality of sequencing signals 24. A first inverter 40A accepts input 12 and outputs the logical complement of the value of input 12. The output of inverter 40A provides the input to a second inverter 40B. The output of inverter 40B is the original value of input 12. The remaining circuitry of switching sequencer 20 operates similarly.

The output of each inverter 40 is provided as one of sequencing signals 24. For example, inverter 40A provides sequencing signal 24A, while inverter 40B provides sequencing signal 24B. As a result, half of sequencing signals 24 provide the true value of input 12, while half provide the complement of the value of input 12. Further, since each inverter 40 takes a finite amount of time to process an input signal and produce an output signal, sequencing signals 24 are provided at different times. For example, sequencing signal 24A only passes through inverter 40A before being produced, while sequencing signal 24B passes through inverters 40A, 40B before being produced. The size and loading of each inverter 40 is matched to provide a uniform propagation of sequencing signals 24. The size, loading, and number of inverters 40 is selected so that the outputs transition between high and low voltages within a desired minimum and maximum transition time, i.e., to obtain the desired slew rate.

Returning to FIG. 1, driver 22 includes a control stage 26 and an output stage 28. Control stage 26 accepts sequencing signals 24, enable 14, and a complement of enable 15 and generates a plurality of control signals 30. Control signals 30 are used by output stage 28 to configure the network of matched resistors used to generate the output signals at outputs 16, 18. Control stage 26 generates control signals 30 in a manner that balances the respective transitions of the output signals at outputs 16, 18.

Figure 3:
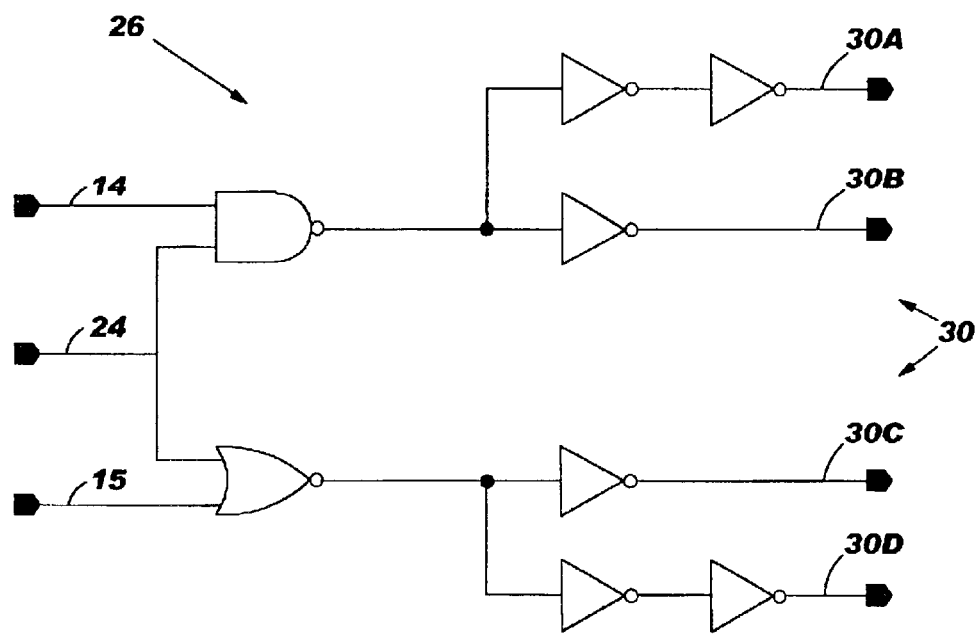
FIG. 3 depicts a partial schematic diagram of one implementation of the control stage shown in FIG. 1.

FIG. 3 depicts a partial schematic diagram of one implementation of control stage 26. Control stage 26 includes the circuitry depicted for each sequencing signal 24. As shown, each sequencing signal 24 is provided to control stage 26 along with enable 14 and the complement of enable 15. To generate control signals 30 (30A, 30B, 30C, 30D), logical operations are performed using the inputs. Sequencing signal 24 is logically combined with enable 14 using the NAND logical operation, and is logically combined with complement of enable 15 using the NOR logical operation. The result of each logical operation is then rebuffered into two control signals 30, the result itself and its complement. As a result, control stage 26 produces four control signals 30 for each sequencing signal 24, or twenty-four total control signals 30 for this embodiment.

Figure 4:
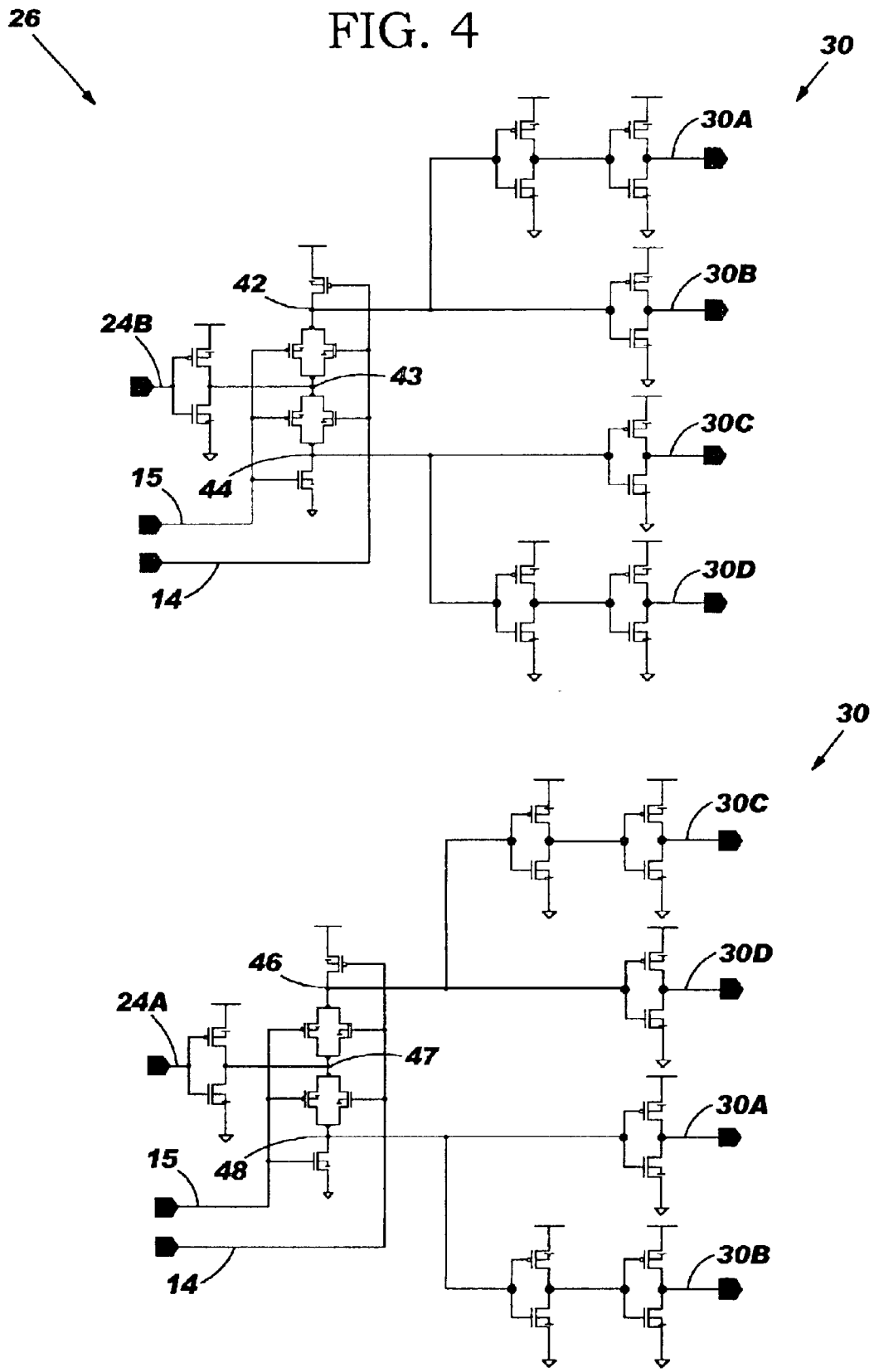
FIG. 4 depicts a partial transistor level schematic diagram of one implementation of the control stage shown in FIG. 3.

For precise control of the output signals, control stage 26 should produce the four control signals 30 for each sequencing signal 24 as close in time as possible. However, NAND and NOR circuits do not behave symmetrically. To minimize the time window during which the four control signals are produced, the NAND and NOR circuits can be implemented using a passgate technique. Using this technique, the NAND and NOR logic functions can be implemented in functionally balanced circuits. FIG. 4 depicts a partial transistor level schematic diagram of control stage 26 implemented using the passgate technique. The circuitry for generating control signals 30 based on sequencing inputs 24A and 24B are shown. When sequencing inputs 24 are generated using a series of inverters as discussed above, the location of the desired values for sequencing inputs 24 differs based on whether the sequencing input 24 represents the true or complement value of the input. As a result, while the circuitry is identical for each sequencing input 24, the resulting control signals 30 are located differently.

Using this circuit, the signal at junction 43 is equivalent to NOT input 12 since switching signal 24B represents the true value of input 12. The passgate technique generates a signal at junction 42 that is either high when enable 14 is low, or is the value of NOT input 12. Therefore, the signal at junction 42 represents the logical expression: NOT input 12 OR NOT enable 14. This value is logically equivalent to the desired signal at control signal 30A of: enable 14 NAND input 12, and its complement at control signal 30B can be logically stated as: enable 14 AND input 12.

Similarly, the passgate technique generates a signal at junction 44 that is only high when enable 14 is high and the value of NOT input 12 is high. Therefore, the signal at junction 44 represents the logical expression: NOT input 12 AND enable 14. This is logically equivalent to the desired signal at control signal 30D of: NOT enable 14 NOR input 12, and its complement signal at control signal 30C can be represented as: NOT enable 14 OR input 12.

The signal 24A represents the complement of input 12. Consequently the value at junction 47 is equivalent to input 12. Based on the discussion above, the value at junction 46 is the complement of the value at junction 44, and the value at junction 48 is the complement of the value at junction 42. As a result, control signals 30A and 30B are generated from junction 48, while control signals 30C and 30D are generated from junction 46.

Figure 5:
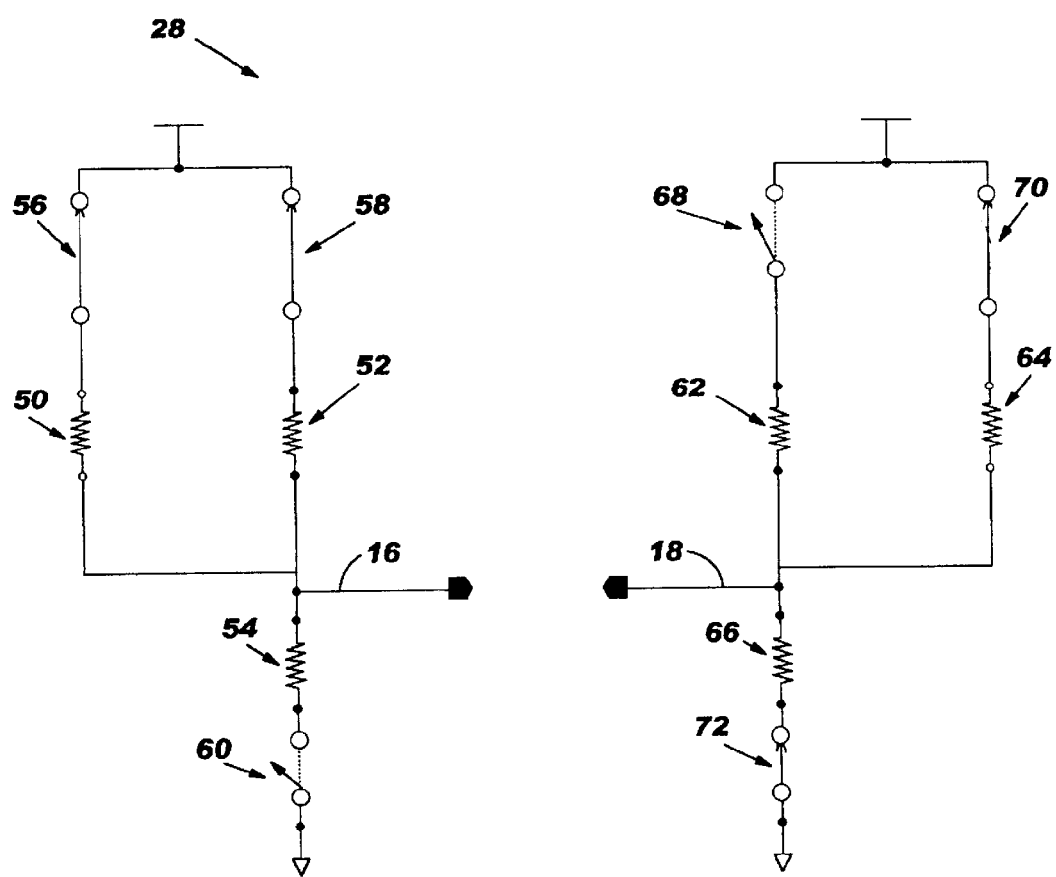
FIG. 5 depicts a partial functional block diagram of one implementation of the output stage shown in FIG. 1.

Returning to FIG. 1, control signals 30 and complement of enable 15 are provided to output stage 28. Output stage 28 configures a network of matched resistors that generates the output signals at outputs 16, 18 based on these inputs. In operation, when input 12 is high, the signal at output 16 is higher than the signal at output 18. Conversely, when input 12 is low, the signal at output 18 is higher than the signal at output 16. FIG. 5 depicts a partial functional block diagram of one implementation of output stage 28. Output stage 28 is depicted when the input signal is high. For illustrative purposes, switches are shown. However, as discussed below, nfet and pfet devices can be used to configure the circuit.

As depicted, the network for generating the output signal at output 16 can be reduced to the parallel combination of resistors 50, 52 connected to $V_{dd}$, and a resistor 54 connected to ground. Each resistor 50, 52, 54 is gated using switches 56, 58, 60, respectively. In operation, switch 56 is only open when the enable signal goes low, i.e., the device is tristated, switch 58 is closed when the device is not tristated and the input is high, and switch 60 is closed when the device is not tristated and the input is low. Consequently, during normal operation, switch 58 and switch 60 are complementary, while switch 56 is always closed. Therefore, current always flows through resistor 50, current flows through resistor 52 when the input is high, and current flows through resistor 54 when the input is low. This operation results in the signal at output 16 being pulled high when the input is high, and pulled low when the input is low.

Since the signal at output 18 is low when the input is high, and high when the input is low, the network for generating the output signal at output 18 functions in a similar manner, but in the reverse. The network also can be reduced to the parallel combination of resistors 62, 64 connected to $V_{dd}$, a resistor 66 connected to ground, and switches 68, 70, 72 controlling current flow through resistors 62, 64, 66, respectively. When tristated, switches 68, 70, 72 are all open. During normal operation, switch 70 is closed, switch 68 is closed when the input is low, and switch 72 is closed when the input is high.

As shown, resistor 50 is connected in parallel with resistor 52. When the circuit is viewed from an AC standpoint, the $V_{dd}$ node can be considered as being connected to an ideal voltage source across $V_{dd}$ and ground. Since an ideal voltage source has zero impedance, resistor 50 and resistor 54 can also be viewed as a parallel combination of resistors. The parallel combination of resistors can be selected to result in a desired effective impedance and the desired offset voltage.

Returning to FIG. 1, switching sequencer 20 generates six sequencing signals 24. After the first sequencing signal 24 is generated, each succeeding sequencing signal is generated after a propagation delay from the previous sequencing signal 24. Control stage 26 generates four control signals 30 for each sequencing signal 24. Because the circuitry for generating each control signal 30 is identical, control signals 30 are generated in groups of four separated by the propagation delay. In this manner, control signals 30 are provided to output stage 28.

Figure 6:
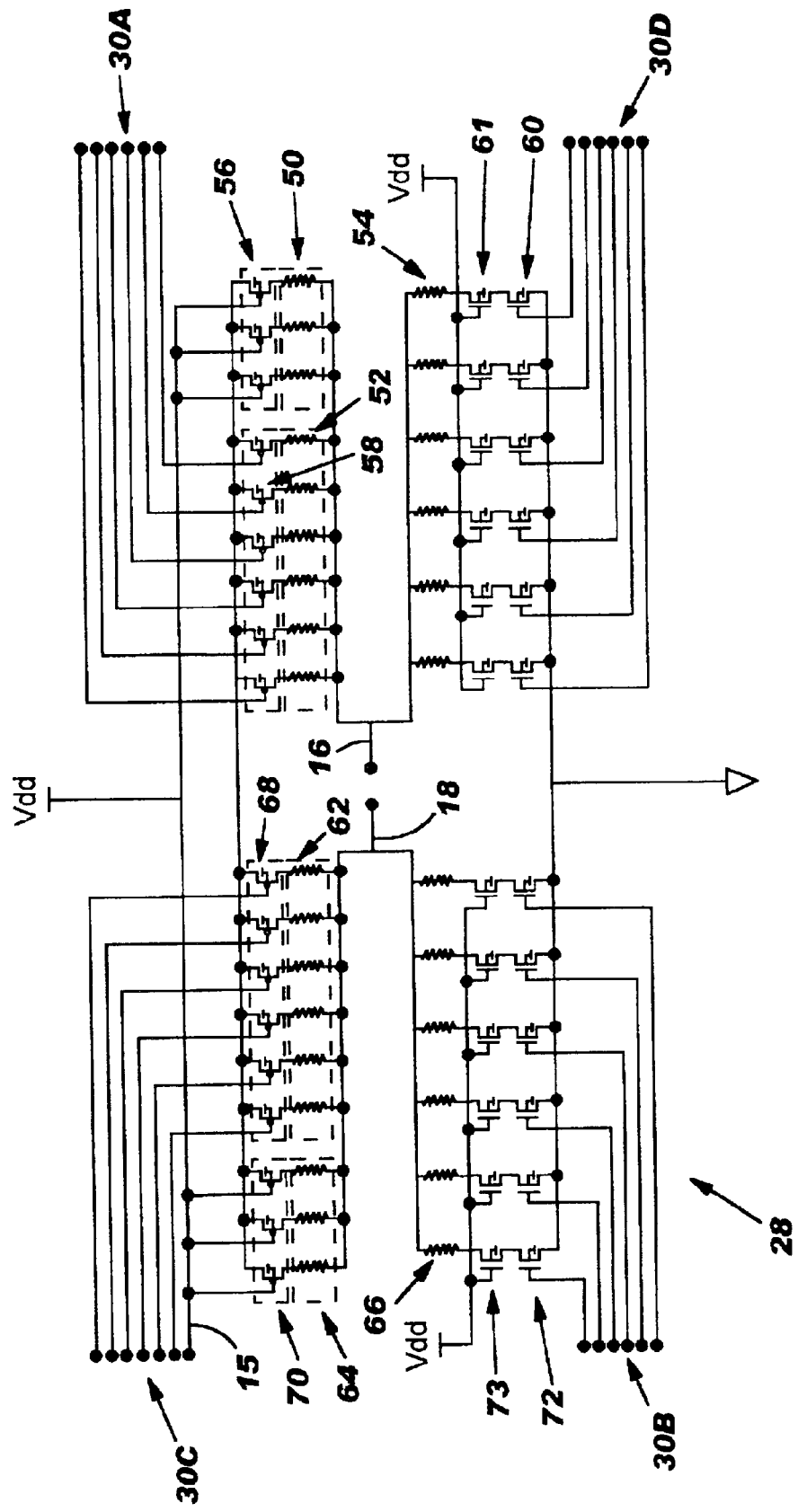
FIG. 6 depicts a schematic diagram of one implementation of the output stage partially shown in FIG. 5.

FIG. 6 depicts a schematic diagram of one implementation of output stage 28 as partially shown in FIG. 5. Enable complement 15 operates pfet devices 56, 70 that provide the tristate capability for resistors 50, 64, respectively. Control signals 30 are broken up into four groups of six, in which each control signal 30 in the group is identical, but delayed from a previous control signal 30 by the propagation delay. To obtain the desired operation and tristate capability, control signals 30A operate pfet devices 58 that switch resistors 52. The complements of control signals 30A, control signals 30B, operate nfet devices 72 that switch resistors 66. Similarly, control signals 30C operate pfet devices 68 that switch resistors 62, and their complement, control signals 30D operate nfet devices 60 that switch resistors 54. The impedance of the various nfet and pfet devices are accounted for in selecting the appropriate impedances of resistors 50, 52, 54, 62, 64, 66 to obtain a desired impedance on each resistor line.

The circuit is also shown including nfet devices 61, 73 in series with nfet devices 60, 72 respectively. The enables of nfet devices 61, 73 are shown tied to $V_{dd}$ so that the devices are always enabled and do not impact operation of output stage 28. The inclusion of nfet devices 61, 73 simplifies the matching of impedances and predriver loadings with the pfet devices since nfet devices generally perform substantially better than pfet devices. Additionally, nfet devices have a lower stress tolerance to external voltages than pfet devices. Consequently, the inclusion of the second nfet devices 61, 73 also provides additional tolerance to withstand external voltage spikes.

Because of the balanced configuration of the network of matched resistors, the transition between voltages at outputs 16, 18 occurs in a highly symmetric fashion. Using the passgate implementation shown in FIG. 4 provides further symmetry. For example, output 16 is controlled using control signals 30A, 30D. In the implementation shown in FIG. 4, control signals 30A, 30D are generated using functionally balanced paths. Control signals 30B, 30C are generated in a similar manner to control output 18. As a result, output stage 28 nearly simultaneously turns on as many nfet and pfet devices as it turns off. This yields a clean transition with minimal noise due to current spiking. Further, the cross-over point of the circuit is not data pattern dependent, i.e., the cycle-dependent jitter that exists in previous implementations does not occur in the current invention.

The illustrative circuit and method described above have been configured to perform according to the standards required in IEEE Std 1596 and are not meant to limit the invention to this particular circuit and method. Consequently, it is optimized to support system applications in which a 100 Ohm termination resistor is connected across the input pins of a differential receiver. Obviously, numerous modifications to the circuit and method can be made to improve/reduce performance abilities. For example, in FIG. 2 six inverters are provided. The selection of more or less inverters can increase or decrease the time in which each output transitions between high and low voltages. Alternatively, circuitry other than inverters can be used to generate the switching outputs to adjust the rate of performance. Similarly, while an enable signal is incorporated to provide tristate capability, this capability can be removed from the circuit and method without departing from the invention.

Similarly, under IEEE Std 1596, outputs 16, 18 must maintain voltages roughly between 1.0 V and 1.4 V. As shown in FIG. 6, pfet devices 56, 58, 68, 70 are tied to $V_{dd}$, which is normally around 1.8 V. Consequently, to maintain output voltages in the desired range, resistors 50, 64 provide effective impedances of 300 Ohms (accounting for the impedance of the pfet devices). Since IEEE Std 1596 further specifies an output impedance of between 40 and 140 Ohms, resistors 52, 54, 62, 66 provide effective impedances of 150 Ohms. As a result, the effective parallel combination of the 300 Ohm and 150 Ohm resistors yields an effective impedance for each output 16, 18 of 100 Ohms. When implemented, the resistance mismatch for outputs 16, 18 is less than five percent, well within the ten percent allowed under IEEE Std 1596.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

What is claimed is:

1. A differential signal driver comprising:
a switching sequencer capable of providing a plurality of sequencing signals; and
a driver having a control and an output stage, the control stage generating a plurality of control signals for each one of the sequencing signals, the output stage generating a first output signal and a second output signal in response to receiving the plurality of control signals.

2. A circuit for generating a differential voltage signal comprising:
first and second resistor networks each having a plurality of resistor sets capable of generating a voltage level at a different output in response to a plurality of sequencing signals, each one of the resistor sets including:
a first resistor having a first enable state, and being gated by a first gate; and
a second resistor having a second enable state that is complementary to the first enable state during normal operation, and being gated by a second gate.

3. A method of generating a differential voltage signal, the method comprising:
receiving a digital input;
providing a plurality of sequencing signals based on the digital input;
generating a set of control signals for each of the plurality of sequencing signals;
gating a pair of resistors on a first resistor network and a pair of resistors on a second resistor network using one of the sets of control signals;
generating a first voltage at a first output based on the first resistor network; and
generating a second voltage at a second output based on the second resistor network, wherein a difference of the first voltage and the second voltage comprises the differential voltage signal.

4. The differential signal driver of claim 1, wherein the plurality of sequencing signals are provided at substantially uniform propagation delays.

5. The differential signal driver of claim 1, wherein the plurality of control signals are generated using functionally balanced circuits.

6. The circuit of claim 2, wherein each resistor set further comprises a third resistor that provides parallel impedance to both the first resistor and the second resistor.

7. The circuit of claim 6, wherein the third resistor is gated by a third gate, and wherein the first gate, the second gate, and the third gate are tristated using an enable signal.

8. The circuit of claim 2, wherein each resistor set on the first network is associated with a unique resistor set on the second network.

9. The circuit of claim 8, wherein each associated pair of resistor sets are configured based on one of the sequencing signals.

10. The circuit of claim 2, further comprising:
a switching sequencer for providing the plurality of sequencing signals based on a digital input, wherein the plurality of sequencing signals are provided at uniform propagation delays; and
a control stage for generating a set of control signals for each of the plurality of sequencing signals.

11. The differential signal driver of claim 10, wherein the switching sequencer includes a plurality of inverters, and wherein each sequencing signal is an output of an inverter.

12. The method of claim 3, wherein the gating step includes, for each pair of resistors:
disabling an electrical path for a first resistor on the first resistor network based on a first control signal;
enabling an electrical path for a second resistor on the first resistor network based on a second control signal;
disabling an electrical path for a first resistor on the second resistor network based on a third control signal; and
enabling an electrical path for a second resistor on the second resistor network based on a fourth control signal.

13. The method of claim 12, wherein the first control signal is complementary to the fourth control signal and the second control signal is complementary to the third control signal.

14. The method of claim 3, wherein the generating a set of driver signals steps includes:
receiving an enable signal;
receiving a sequencing signal;
generating a first pair of control signals based on a logical NAND operation performed on the enable signal and the sequencing signal; and
generating a second pair of control signals based on a logical NOR operation performed on a complement of the enable signal and the sequencing signal.

15. The method of claim 3, wherein the configuring step further includes:
gating a third resistor on the first resistor network in parallel with each of the pair of resistors on the first resistor network;
gating a third resistor on the second resistor network in parallel with each of the pair of resistors on the second resistor network; and
tristating each resistor on each resistor network using an enable signal.

* * * * *